United States Patent
Cromwell

(10) Patent No.: US 7,536,781 B2
(45) Date of Patent: May 26, 2009

(54) METHOD OF ASSEMBLING AN APPLICATION SPECIFIC INTEGRATED CIRCUIT (ASIC) ASSEMBLY WITH ATTACH HARDWARE

(75) Inventor: Stephen Daniel Cromwell, Penryn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1083 days.

(21) Appl. No.: 10/455,862

(22) Filed: Jun. 6, 2003

(65) Prior Publication Data
US 2004/0246679 A1 Dec. 9, 2004

(51) Int. Cl.
*H05K 3/30* (2006.01)
(52) U.S. Cl. .............. 29/832; 29/830; 29/739; 29/740; 361/704; 411/150; 411/231; 411/544
(58) Field of Classification Search .......... 29/830, 29/832, 739, 740; 174/260, 261, 262–266; 361/780, 744, 792–795, 704; 411/150, 231, 411/544

See application file for complete search history.

(56) References Cited

U.S. PATENT DOCUMENTS

| 4,333,351 | A | * | 6/1982 | Bickford ............... 73/761 |
| 5,307,236 | A | * | 4/1994 | Rio et al. ............. 361/720 |
| 5,709,514 | A | * | 1/1998 | Suggs et al. .......... 411/150 |
| 5,880,930 | A | | 3/1999 | Wheaton |
| 5,917,703 | A | | 6/1999 | Murphy |
| 5,919,050 | A | | 7/1999 | Kehley et al. |
| 6,198,630 | B1 | * | 3/2001 | Cromwell ............. 361/704 |
| 6,654,250 | B1 | * | 11/2003 | Alcoe ................... 361/719 |
| 6,794,581 | B2 | * | 9/2004 | Smith et al. .......... 174/260 |

* cited by examiner

*Primary Examiner*—Rick K Chang

(57) ABSTRACT

A method of assembling an Application Specific Integrated Circuit (ASIC) assembly with attach hardware includes selecting a thickness of a load washer based on a target load to be applied by said attach hardware.

5 Claims, 3 Drawing Sheets

METHOD OF ASSEMBLING AN APPLICATION SPECIFIC INTEGRATED CIRCUIT (ASIC) ASSEMBLY WITH ATTACH HARDWARE

BACKGROUND

An Application-Specific Integrated Circuit (ASIC) is a microchip designed for a special application. The ASIC is designed to process information or complete tasks in a manner specific to the intended application. For example, ASICs are used in such diverse applications as auto emission control, environmental monitoring, and personal digital assistants (PDAs). ASICs are contrasted with general integrated circuits that can be used to perform different tasks for different applications. Examples of general integrated circuits include the microprocessor and the random access memory chips in a typical personal computer.

An ASIC can be mass-produced for a special application or can be custom manufactured for a particular customer application. Custom production is typically performed using components from a "building block" library of ASIC components. Each ASIC includes a number of input/output (I/O) leads that allow the ASIC to be connected to a larger circuit and receive the signals and data with which the ASIC works. These I/O leads are typically arranged in an array known as a Land Grid Array (LGA). The ASIC is usually attached to a circuit board, such as a printed circuit board (PCB). Leads or a socket on the circuit board make contact with the I/O leads of the LGA and connect the ASIC to the larger circuit of which it is a part.

The ever growing I/O count in today's large ASICs requires a very high clamping load to secure the ASIC to the circuit board and ensure continuous electrical contact between the ASIC and the circuit on the PCB. Clamping loads in the range of 400 to 700 pounds are becoming common. As noted, a socket may be provided on the PCB into which the ASIC is clamped.

The load necessary to secure the ASIC to the PCB is produced by the hardware used to attach the ASIC to the circuit board. This hardware is frequently referred to as the "attach hardware." The attach hardware includes a bolster plate and a load plate. The load plate is a rigid plate that is typically made of steel and is sometimes referred to as a spring plate. The bolster plate is similar.

The ASIC assembly is sandwiched between the load plate and the bolster plate. Load studs connect the load plate and bolster plate, and a load screw is tightened to push the load plate and bolster plate apart causing the load plate to flex and generate the desired clamping force to the ASIC and circuit board.

Because the clamping load required is so high, the force can cause the PCB and/or the bolster plate to bow or deflect. This will impede the operation and performance of the socket or other connection between the ASIC and the PCB. Consequently, the bow of the bolster plate must be minimized. In some applications, this requires minimizing the load applied. On the other hand, the socket or connection between the ASIC and PCB requires a certain minimum load to be reliable. The result is that the load is constrained from above and below. The load must be sufficient to provide a reliable connection in the socket or between the ASIC and PCB, but must not be strong enough to cause a significant bow in the bolster plate or circuit board. Consequently, the load range must be minimized.

Previous designs have attempted to minimize load range by providing a hard stop for the load screw that limits the load that can be applied. In other instances, torque settings or measurements are taken to insure the load screw is operated within a narrow load range.

SUMMARY

A method of assembling an Application Specific Integrated Circuit (ASIC) assembly with attach hardware includes adjusting or selecting a thickness of a load washer based on a target load to be applied by said attach hardware.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

Throughout the drawings, identical reference numbers designate similar, but not necessarily identical, elements.

DETAILED DESCRIPTION

The present specification describes a method and system of using a washer with a particular thickness to control the range of the load applied by a load screw in an ASIC assembly including attach hardware. The thickness of the washer is adjusted or selected for each assembly based on the measured spring rate of the load plate or plates so that the deflection of the load plate when put in service produces the target load.

Figure 1:
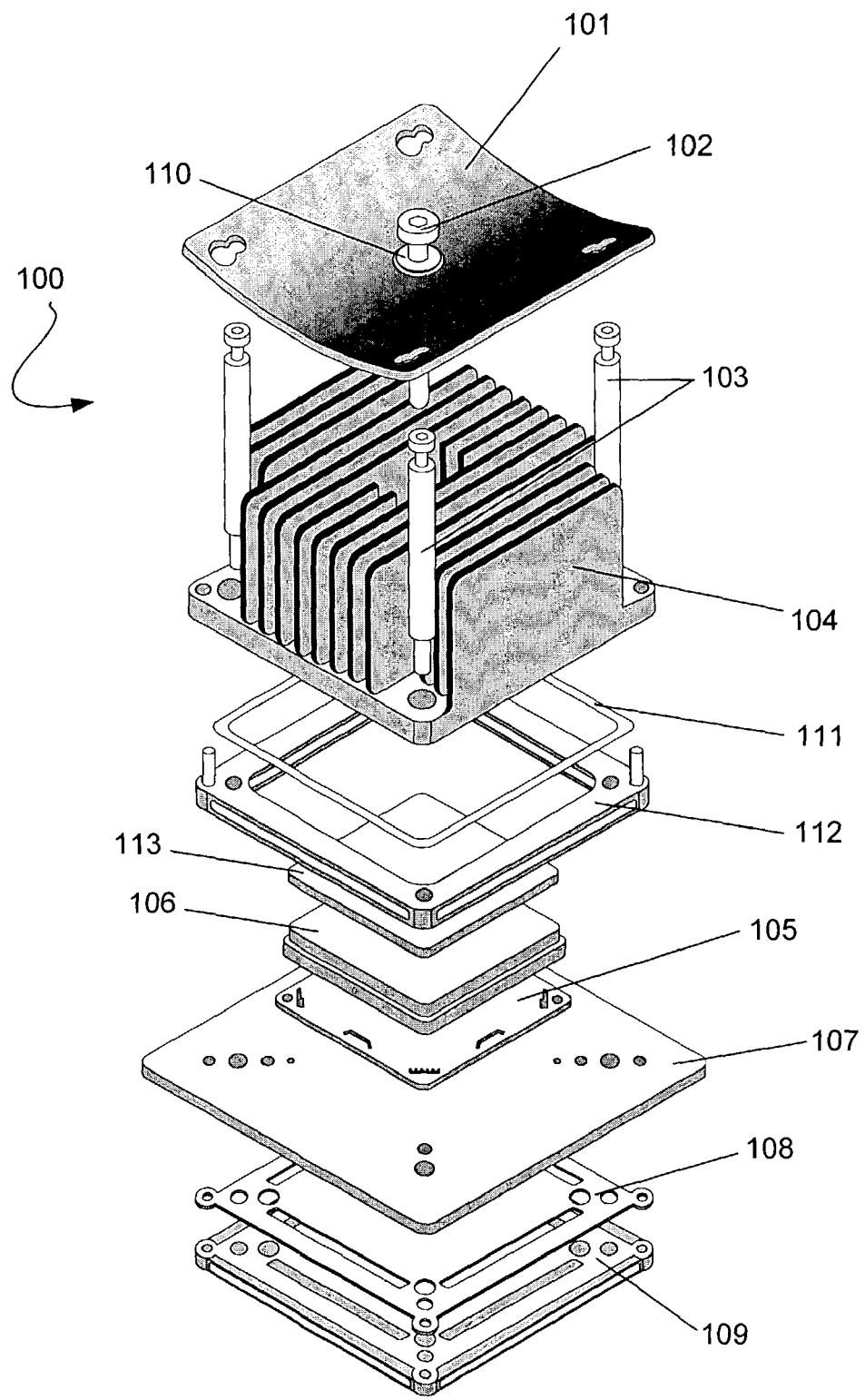
FIG. 1 is an exploded view of an ASIC assembly including an attach hardware assembly designed to provide a desired load according to an embodiment of the present invention.

FIG. 1 illustrates an ASIC assembly (100) with attach hardware. The assembly includes a specifically selected washer for controlling the load applied by the load screw. As shown in FIG. 1, a typical ASIC assembly includes an ASIC (106) that is electrically connected to a circuit board (107), for example a printed circuit board. Typically, the ASIC (106) is connected to the circuit board (107) using a socket (105). An insulator (108) is disposed below the circuit board (107) to insulate the circuit board (107) from the attach hardware assembly which will be described below.

A heat sink (104) is typically included in the assembly to dissipate heat generated by the ASIC (106). An ASIC (106) will generate heat as it operates and, if this heat is not dissipated, can cause damage to the ASIC (106) or other components of the assembly (100). An Electro Magnetic Interference (EMI) gasket (111) and EMI frame (112) are also positioned between the heat sink (104) and the circuit board (107). A thermstrate (113) is positioned between the heat sink (104) and the ASIC (106) to enhance the thermal interface and improve thermal conduction between the two.

As described above, the ASIC (106) and circuit board (107) are held together with an assembly of attach hardware. Among other things, the attach hardware includes a load plate (101) and a bolster plate (109). Load studs (103) are also part of the attach hardware and run between the load plate (101) and the bolster plate (109).

Another component of the attach hardware is a load screw (102). The load screw (102) is designed to separate the load plate (101) and the bolter plate (109) to generate the desired load to the ASIC assembly components by deflecting the load plate (101). The circuit board (107), the socket (105), the ASIC (106) and the thermal interface material (113) are sandwiched between the bolster plate (109) and the heat sink (104). The load screw (102) is driven into the load plate (101) through a washer (110). The washer (110), which will be described in more detail below, controls or limits the range of load that the attach hardware assembly applies.

Figure 2:
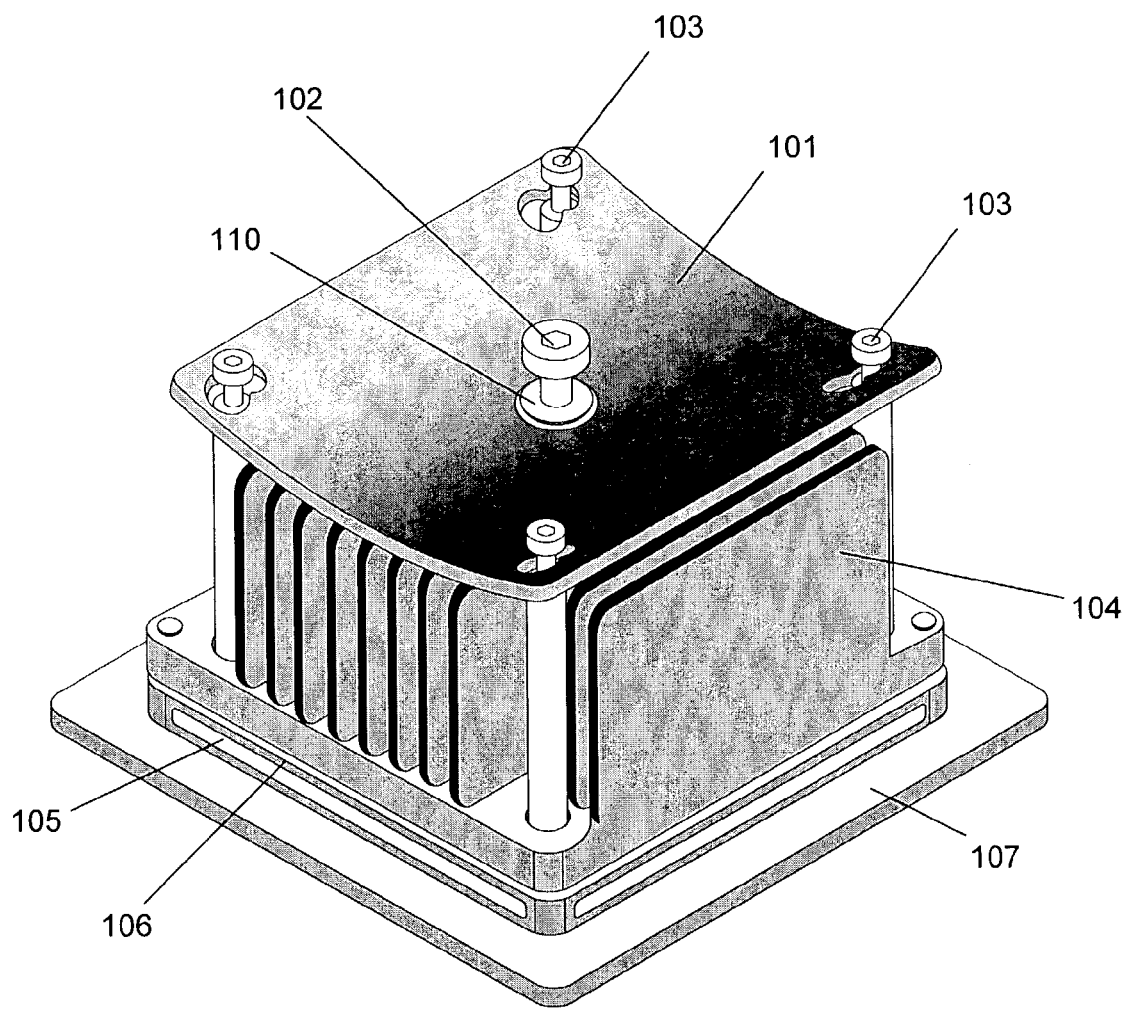
FIG. 2 is an illustration of the ASIC assembly of FIG. 1 when fully assembled.
Figure 3:
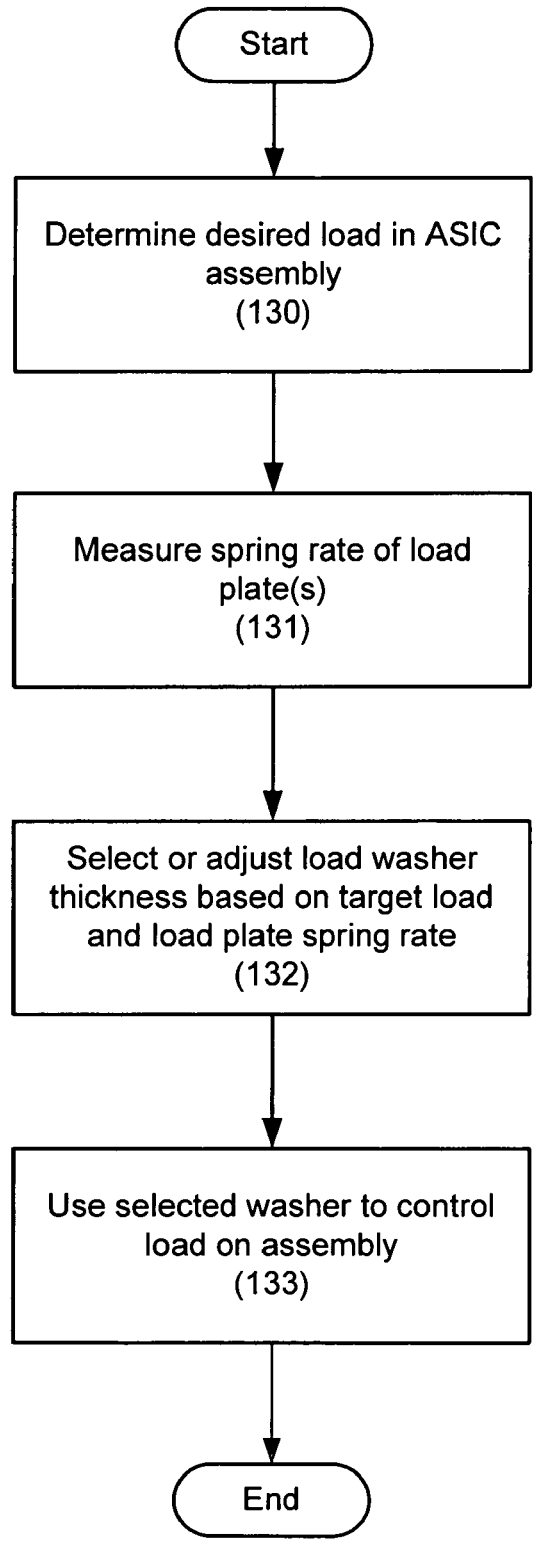
FIG. 3 is a flowchart illustrating a method of controlling the load applied by an attach hardware assembly according to another embodiment of the present invention.

As shown in FIG. 1, the heat sink (104), ASIC (106), socket (105), circuit board (107) and insulator (108) are all sandwiched between the load plate (101) and the bolster plate (109) to complete the ASIC assembly (100). Assembly of the ASIC assembly (100) is performed as follows. The bolster plate (109) and EMI Frame (112) are attached to the circuit board (107) via the load studs (103). The socket (105) and ASIC (106) are placed onto the circuit board (107). Then, the heatsink (104) is lowered down onto the ASIC (106) over the load studs (103). The load plate assembly (101, 102) is shuttled onto the load studs (103) and the load screw (102) is turned until the gap between the load adjust washer (110) and the screw head is closed. The assembled unit is illustrated in FIG. 2. However, in FIG. 2, the load screw (102) is not fully inserted. When the load screw (102) is tightened, the head of the load screw (102) is brought into contact with the washer (110) and applies pressure to deflect the load plate (101).

The final load applied is a function of the z-axis tolerance loop of the components and the material variations that impact the spring rate of the load plate (101). The component tolerances can be managed by careful design and specification but cannot be eliminated. In this particular design, that tolerance is, for example, +/−0.022". For high load designs (e.g., 550 lbs of load) with large spring rates (e.g., about 2500 lbs/in), the resulting load tolerance due to component z-axis tolerances can be large (e.g., +/−55 lbs). The load tolerance due to spring rate variation of the load plate can be even higher. This variation is most strongly a function of the plate (101) material thickness tolerance. In the embodiment shown, the load plate (101) is comprised of two stacked plates with thickness tolerances of +/−0.002". This results in a +/−68 lb load tolerance.

In prior designs, the load screw (102) was turned until it came to a stop against another component. This results in the stack and spring rate tolerances being combined to result in very high load tolerances (e.g., +/−123 lbs).

In order to eliminate or vastly reduce this tolerance, the thickness of the load washer (110) is adjusted in the load plate assembly (101, 102 and 110) to compensate for the variation in spring rate due to material thickness tolerance in the load plate or plates (101). The load plate (101) is characterized or measured and a washer (110) of the appropriate thickness is placed in the assembly so that the resulting load plate deflection once installed in the assembly results in the target load.

The appropriate thickness for the washer (110) may be determined for each unit. Alternatively, the thickness of the washer (110) may be adjusted only when a new lot of material is introduced for forming load plates (101). This is because the material thickness doesn't vary much within a run of material.

This allows for the use of standard material instead of special material rolled to tighter thickness tolerances. Standard stock material is cheaper and more widely available. Specially toleranced material has to be ordered in mill run quantities and as a result there is a large minimum order quantity and a large lead time.

FIG. 4 is a flowchart illustrating a method of managing the load applied to an ASIC assembly through the thickness of the load washer. As shown in FIG. 4, we first determine the load that should be applied to the ASIC assembly (step 130). As noted above, this target load will be selected to insure the connection between the ASIC and the circuit board, but will also be selected with an eye toward avoiding the bowing of the circuit board or bolster plate and the consequently adverse effect on the connection between the ASIC and the circuit board.

Next, the spring rate of the load plate is measured (step 131). As noted above, the load plate may be a single plate or may be two or more stacked plates. In any case, the spring rate of the load plate assembly is measured.

When the attach hardware is assembled and the load screw is turned until the load plate just begins to deflect, the gap between the washer and the screw represents the deflection of the load plate when the assembly is completed. By adjusting the washer thickness, this gap is changed to match the stiffness of the load plate. A stiffer load plate requires less deflection to achieve the target load, so a thicker washer is used to reduce the gap and thus the deflection of the load plate. Thus, the desired load, as determined in (step 130), can be achieved by selecting or adjusting the thickness of the load washer in response to the measured spring rate of the load plate assembly.

Finally, the selected load washer is used in the assembly to control the load created in the ASIC assembly when the attach hardware is assembled (step (133). In this way, the desired load is more accurately and consistently achieved.

The preceding description has been presented only to illustrate and describe embodiments of invention. It is not intended to be exhaustive or to limit the invention to any precise form disclosed. Many modifications and variations are possible in light of the above teaching. It is intended that the scope of the invention be defined by the following claims.

What is claimed is:

1. A method of assembling an Application Specific Integrated Circuit (ASIC) assembly with attach hardware, said method comprising selecting a thickness of a load washer based on a target load to be applied by said attach hardware; and measuring a spring rate of a load plate of said attach hardware.

2. A method of assembling an Application Specific Integrated Circuit (ASIC) assembly with attach hardware including a load screw driven through a load washer and into a load plate, said method comprising selecting a thickness of said load washer in accordance with a target load and a spring rate of said load plate.

3. The method of claim 2, further comprising determining said target load before selecting said thickness of said load washer.

4. The method of claim 2, further comprising measuring said spring rate of said load plate of said attach hardware.

5. The method of claim 2, further comprising using said load washer to limit deflection of the load plate to control a load applied to said ASIC assembly in accordance with said target load.

* * * * *